US007263628B2

(12) United States Patent
Gauthier et al.

(10) Patent No.: US 7,263,628 B2
(45) Date of Patent: Aug. 28, 2007

(54) METHOD AND APPARATUS FOR RECEIVER CIRCUIT TUNING

(75) Inventors: Claude R. Gauthier, Cupertino, CA (US); Aninda K. Roy, San Jose, CA (US); Pradeep R. Trivedi, Sunnyvale, CA (US); Brian W. Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 563 days.

(21) Appl. No.: 10/378,295

(22) Filed: Mar. 3, 2003

(65) Prior Publication Data

US 2004/0177286 A1 Sep. 9, 2004

(51) Int. Cl.
*H04L 7/00* (2006.01)
(52) U.S. Cl. ...................................... 713/401
(58) Field of Classification Search ............... 713/401
See application file for complete search history.

(56) References Cited

U.S. PATENT DOCUMENTS

| 3,557,347 | A | * | 1/1971 | Robertson ................ 708/9 |
| 5,432,944 | A | * | 7/1995 | Nuckolls et al. ............ 713/320 |
| 6,198,309 | B1 | * | 3/2001 | Smetana ..................... 326/126 |
| 6,407,682 | B1 | * | 6/2002 | Jones ......................... 341/100 |
| 6,570,420 | B1 | * | 5/2003 | Trivedi et al. .............. 327/156 |
| 6,617,891 | B2 | * | 9/2003 | Srikanth et al. ............ 327/108 |
| 6,788,045 | B2 | * | 9/2004 | Gauthier et al. ......... 324/76.53 |

* cited by examiner

*Primary Examiner*—Rehana Perveen
*Assistant Examiner*—Eric Chang
(74) *Attorney, Agent, or Firm*—Osha Liang LLP

(57) ABSTRACT

A Mobile Subscriber Directory Assistance (MSDA) system including originating carrier center initiating a directory assistance call, a directory assistance center providing a directory assistance service, and a search environment. The search environment includes an aggregated pointer database and at least one directory number resolution database. A caller requesting a telephone number is connected to a directory assistance service center where search criteria for the requested number are taken. The requested number is identified by searching the aggregated pointer database and the directory number resolution database. The caller is connected to the identified telephone number without releasing this identified telephone number.

20 Claims, 12 Drawing Sheets

METHOD AND APPARATUS FOR RECEIVER CIRCUIT TUNING

BACKGROUND OF INVENTION

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as a "reference clock signal" and shown in FIG. 1 as $SYS_{13}$ CLK) to various parts of the computer system (10). Modern microprocessors and other integrated circuits, however, are typically capable of operating at frequencies significantly higher than the system clock signal, and thus, it becomes important to ensure that operations involving the microprocessor (12) and the other components of the computer system (10) use a proper and accurate reference of time.

One component used within the computer system (10) to ensure a proper reference of time among a system clock signal and a microprocessor clock signal, i.e., "chip clock signal," is a type of clock signal generator known as a phase locked loop, or "PLL" (20). The PLL (20) is an electronic circuit that controls an oscillator such that the oscillator maintains a constant phase relative to a reference signal. Referring to FIG. 1, the PLL (20) has as its input the system clock signal, which is its reference signal, and outputs a chip clock signal (shown in FIG. 1 as CHIP_CLK) to the microprocessor (12). The system clock signal and chip clock signal have a specific phase and frequency relationship controlled by the PLL (20). This relationship between the phases and frequencies of the system clock signal and chip clock signal ensures that the various components within the microprocessor (12) use a controlled and accounted for reference of time. When this relationship is not maintained by the PLL (20), however, the operations within the computer system (10) become non-deterministic.

For example, the system clock signal may have a small voltage potential swing and a slow transition time from a low voltage potential to a high voltage potential, and vice versa, of the small voltage potential swing. The chip clock signal may have a voltage potential swing that is substantially the same as a difference between power supplies' voltage potentials. Also, a transition time from a low voltage potential to a high voltage potential, and vice versa, for the chip clock signal may be faster than the transition time for the system clock signal. The differences between the system clock signal and the chip clock signal may cause a difference in a propagation time through buffers used in the PLL (20). Accordingly, a static phase error may occur. Also, process variations, temperature variations, and/or voltage variations of the microprocessor (12) on which the PLL (20) resides may affect the operation of the PLL (20).

Furthermore, communications between devices, e.g., the microprocessor (12) and integrated circuits (16), require a controlled and accounted for reference of time. For example, FIG. 2 shows a typical communication system (100). A data signal is transmitted from circuit A (112) (i.e., transmitting circuit) to circuit B (134) (i.e., receiving circuit) on a data path (118). The data signal is generated by a logic circuit (114) and output by a driver circuit (116) on circuit A (112). The data signal on data path (118) is propagated to a receiver circuit (136) on circuit B (134). Depending on a process variations, temperature variations, and/or voltage variations of the receiver circuit (136), a time delay may vary between an arrival of the data signal on data path (118) and a corresponding signal representative of the data signal as a local data signal (142). In other words, a propagation delay through the receiver circuit (136) depends on the process variations, temperature variations, and/or voltage variations of an integrated circuit on which the receiving circuit (136) resides.

Although not shown, the communication system (100) could also have a path to transmit a data signal from circuit B (134) to circuit A (112). Accordingly, a propagation delay through a receiver circuit (not shown) on circuit A (112) may vary depending on process variations, temperature variations, and/or voltage variations.

Furthermore, process variations, temperature variations, and/or voltage variations may occur within a single integrated circuit. For example, circuit B (134) may include a plurality of receiver circuits (e.g., receiver circuit (136)) to receive data external and/or internal to circuit B (134). Each of the plurality of receiver circuits may have a propagation delay that differs from the other receiver circuits dependent on process variations, temperature variations, and/or voltage variations.

SUMMARY OF INVENTION

According to one aspect of the present invention, an apparatus comprising a transmission apparatus arranged to generate a control signal where an impedance of a driver circuit is dependent the control signal; a bias generator operatively connected to the transmission apparatus where the bias generator is dependent on the control signal; and a receiver circuit operatively connected to the bias generator where the bias generator is arranged to operatively adjust a propagation delay through the receiver circuit.

According to one aspect of the present invention, a method comprising adjusting a drive strength of a transmitted signal dependent on a control signal; generating a bias signal dependent on the control signal; and adjusting a propagation delay through a receiver circuit dependent on the bias signal.

According to one aspect of the present invention, an apparatus comprising means for adjusting a drive strength of a transmitted signal dependent on a control signal; means for generating a bias signal dependent on the control signal; means for receiving a signal; and means for adjusting the propagation delay through the means for receiving dependent on the means for generating the bias signal.

Other aspects and advantages of the invention will be apparent from the following description and the appended claims.

DETAILED DESCRIPTION

Embodiments of the present invention relate to an apparatus and method for adjusting a propagation delay through a receiver circuit dependent on a control signal. The control signal may be generated to adjust an impedance of a driver circuit. By using a control signal generated to adjust an impedance of a driver circuit, information about process variations, temperature variations, and/or voltage variations may be inferred. Accordingly, the control signal may be used not only by a driver circuit, but also by a receiver circuit.

Figure 3:
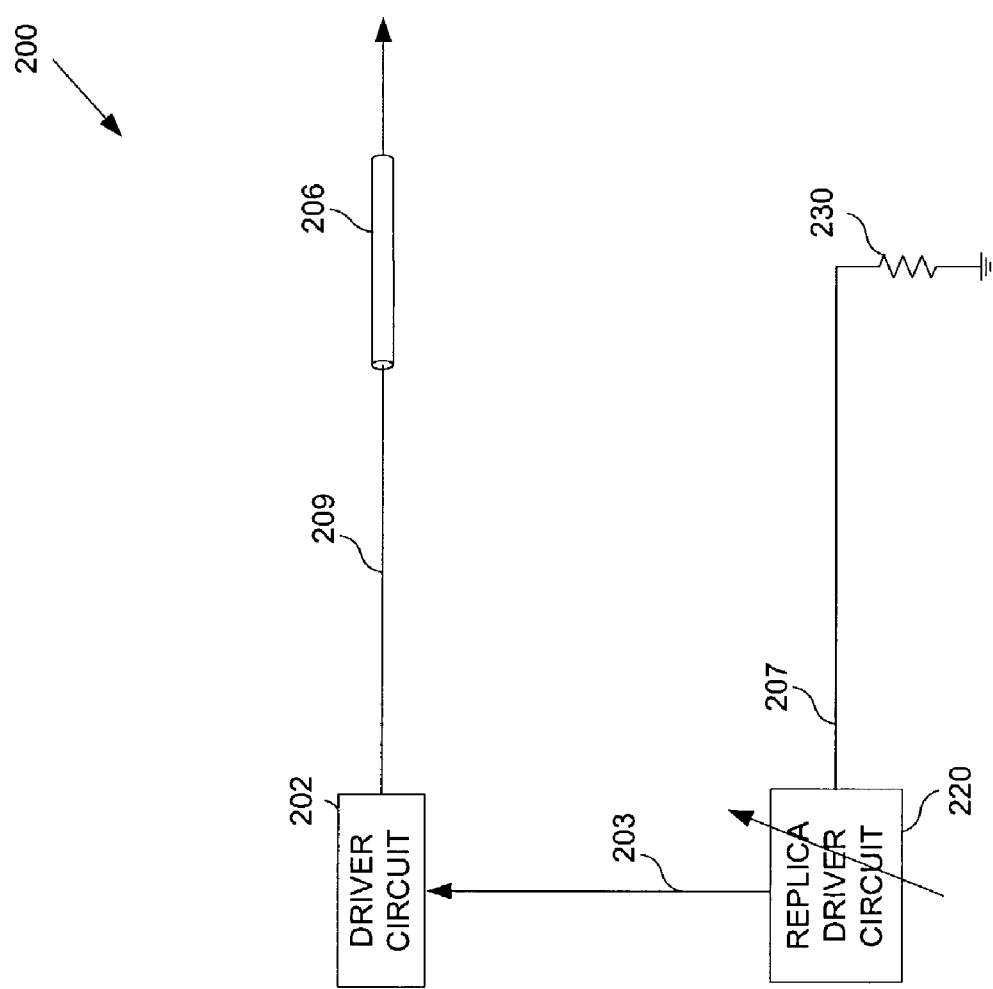
FIG. 3 shows a block diagram of a transmission apparatus in accordance with an embodiment of the present invention.

FIG. 3 shows a block diagram of an exemplary transmission apparatus (200) in accordance with an embodiment of the present invention. The transmission apparatus (200) has a driver circuit (202), a replica driver circuit (220), and a precision resistor (230). The driver circuit (202) generates an output signal (i.e., transmitted signal) (209) on data path (206).

The transmission apparatus (200) adjusts a drive strength of the driver circuit (202) to control an impedance. Accordingly, the output signal (209) may have a desired performance. The replica driver (220) is operatively connected to a precision resistor (230) by line (207). The replica driver (220) determines a desired amount of drive strength using the precision resistor (230) to generate a reference voltage potential. The replica driver (220) adjusts the drive strength of driver circuit (202) using an impedance control code on control line (203).

Figure 4:
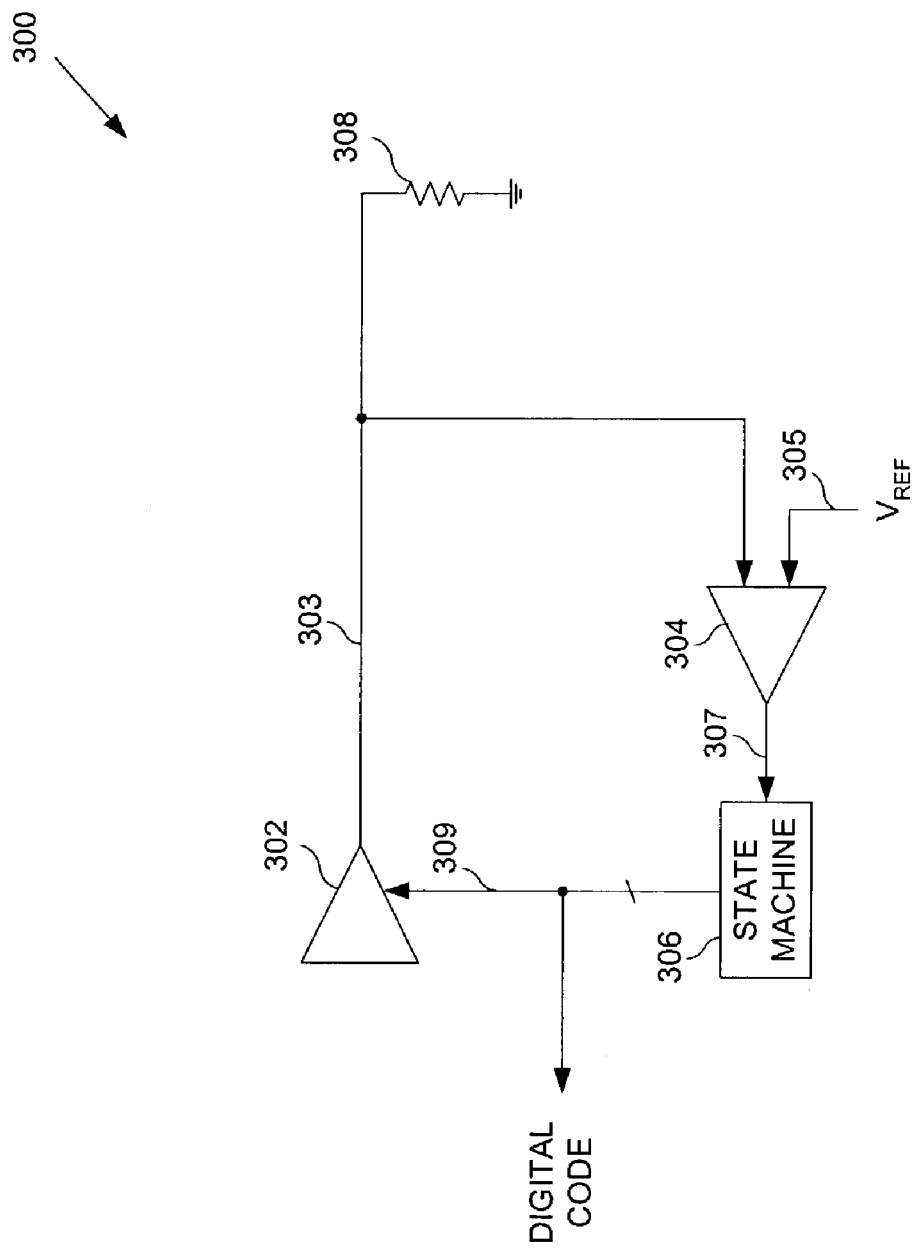
FIG. 4 shows a schematic diagram of a replica driver and resistor in accordance with an embodiment of the present invention.

FIG. 4 shows a schematic diagram of an exemplary replica driver and resistor (300) in accordance with an embodiment of the present invention. The replica driver (300) is arranged to provide a code that represents a known drive strength by a buffer (302). Accordingly, buffer (302) drives a precision resistor (308) using line (303). A resulting reference voltage potential on line (303) occurs. A comparator (304) compares the reference voltage potential on line (303) to a desired reference voltage potential on line (305). The comparator (304) indicates a difference between the reference voltage potential on line (303) and a desired reference voltage potential on line (305).

An output signal on line (307) of the comparator (304) is received by a state machine (306). Dependent on the output signal on line (307), the state machine (306) adjusts the buffer (302) to produce the desired reference voltage potential on line (303). The state machine (306) may use a digital code (i.e., control signal) transmitted on line (309) to adjust the buffer (302). The digital code on line (309) may be a plurality of bits transmitted in series or parallel.

One of ordinary skill in the art having benefit of the present invention will understand that the buffer (302) may be operated in a steady state mode to produce the desired reference voltage potential on line (303). The buffer (302) may also be continuously switched to produce the desired reference voltage potential on line (303). Furthermore, the digital code transmitted on line (309), or a digital code generated as a result of the digital code transmitted on line (309), may be used to determine the impedance control code on control line (203 shown in FIG. 3). Also, the digital code transmitted on line (309) may be used as the impedance control code on control line (203 shown in FIG. 3). The digital code transmitted on line (309) indicates a reference drive strength for the buffer (302). The drive strength of buffer (302) may have a known relationship to the drive strength of the driver circuit (202 shown in FIG. 3).

Figure 5:
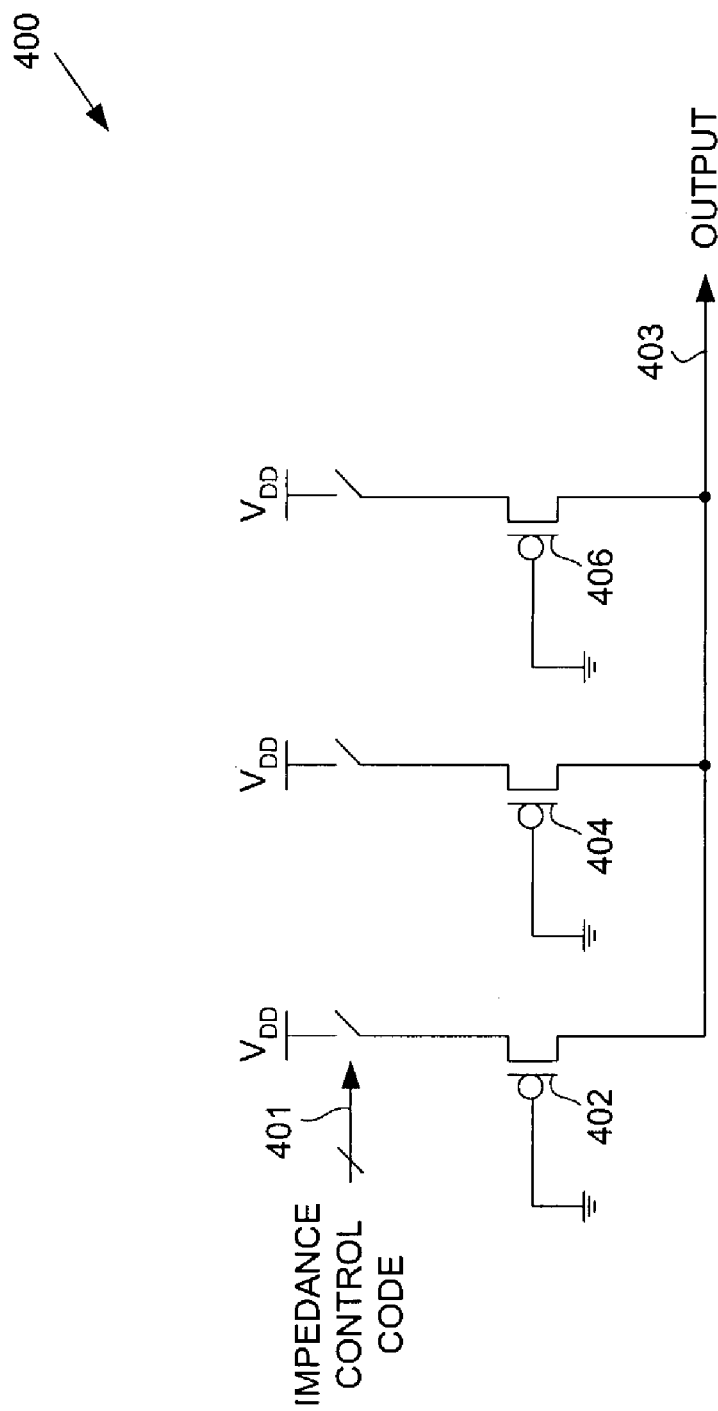
FIG. 5 shows a schematic diagram of a pull-up driver circuit in accordance with an embodiment of the present invention.

FIG. 5 shows a schematic diagram of an exemplary pull-up driver circuit (400) in accordance with an embodiment of the present invention. The pull-up driver circuit (400) includes a plurality of pull-up devices (402, 404, 406). According to one or more embodiments of the present invention, the pull-up devices (402, 404, 406) may each have a different drive strength. The pull-up devices (402, 404, 406) tend to pull a voltage potential of an output signal on line (403) toward a power supply $V_{DD}$ when connected to the power supply $V_{DD}$. An impedance control code (401) determines which of the pull-up devices (402, 404, 406) are connected to the power supply $V_{DD}$. The impedance control code (401) may be a plurality of bits transmitted in series or parallel.

Figure 6:
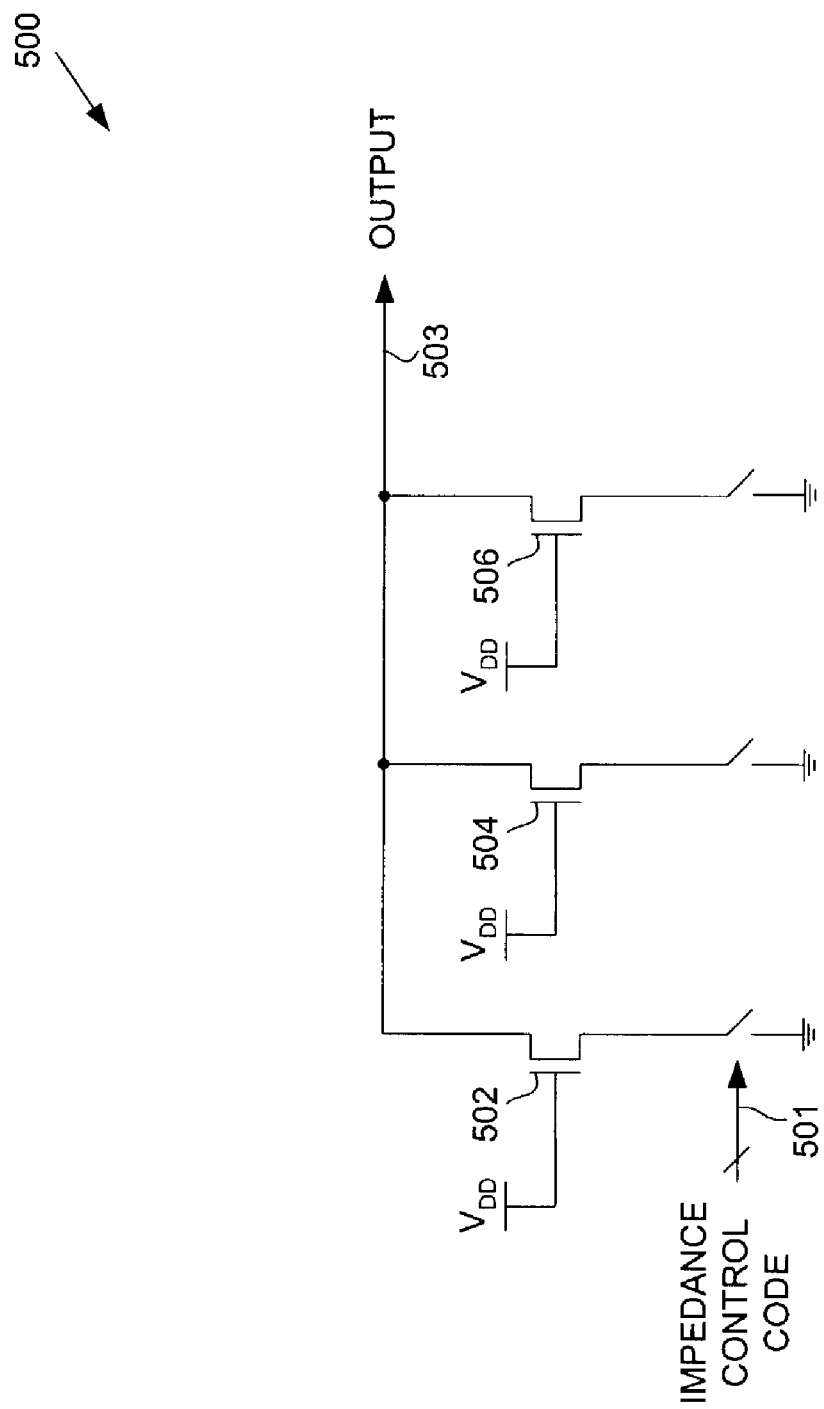
FIG. 6 shows a schematic diagram of a pull-down driver circuit in accordance with an embodiment of the present invention.

FIG. 6 shows a schematic diagram of an exemplary pull-down driver circuit (500) in accordance with an embodiment of the present invention. The pull-down driver circuit (500) includes a plurality of pull-down devices (502, 504, 506). According to one or more embodiments of the present invention, the pull-down devices (502, 504, 506) may each have a different drive strength. The pull-down devices (502, 504, 506) tend to pull a voltage potential of an output signal on line (503) toward a power supply $V_{ss}$ when connected to the power supply $V_{ss}$. An impedance control code (501) determines which of the pull-down devices (502, 504, 506) are connected to the power supply $V_{ss}$. The impedance control code (501) may be a plurality of bits transmitted in series or parallel.

Figure 7:
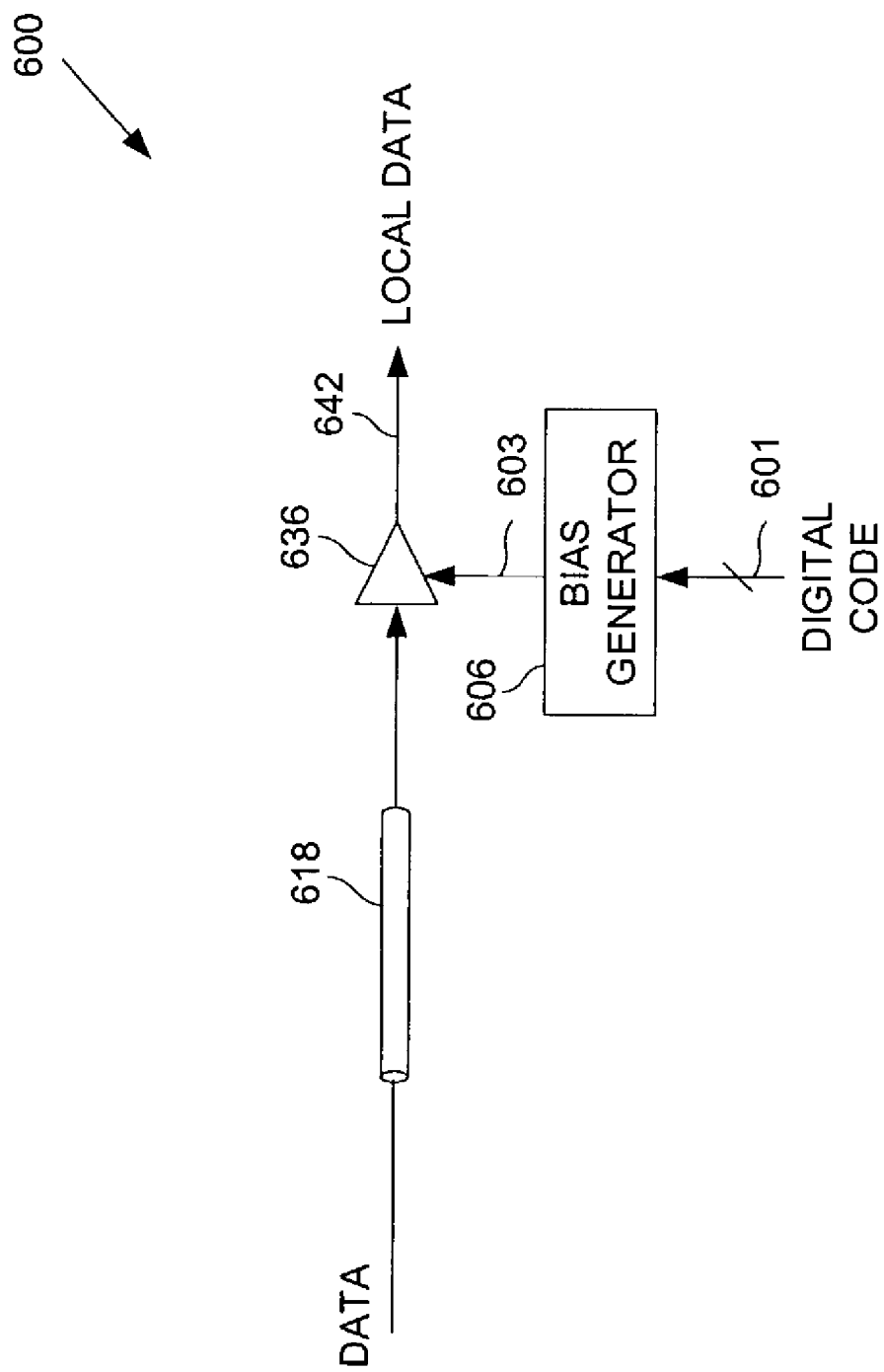
FIG. 7 shows a block diagram of a receiver circuit with an adjustable propagation delay in accordance with an embodiment of the present invention.

FIG. 7 shows a block diagram of an exemplary receiver circuit with an adjustable propagation delay (600) in accordance with an embodiment of the present invention. A data signal may be propagated on data path (618). A receiver circuit (636) may generate a corresponding signal representative of the data signal as a local data signal (642). A propagation delay through the receiver circuit (636) depends on the process variations, temperature variations, and/or voltage variations. For the present invention, a propagation delay may include a temporal delay or any additional delay caused by signal skew, and rise and fall time variations.

The receiver circuit with an adjustable propagation delay (600) includes a bias generator (606) that adjusts a propagation delay of the receiver circuit (636) using biasing signal (603). The bias generator (606) receives a digital code (601) (i.e., control signal) from, for example, a replica driver (220 shown in FIG. 3). The digital code (601) may be representative of an impedance control code, for example, impedance control code (401 shown in FIG. 5). The impedance control code is indicative of adjustments made to a buffer and depends on the process, temperature, and/or voltage of the replica driver. Accordingly, the digital code (601) may be indicative of process variations, temperature variations, and/or voltage variations.

Because the digital code (601) is indicative of conditions that may affect the propagation delay through the receiver circuit (636), the bias generator (606) may use the digital code (601) to adjust the receiver circuit (636).

Figure 8:
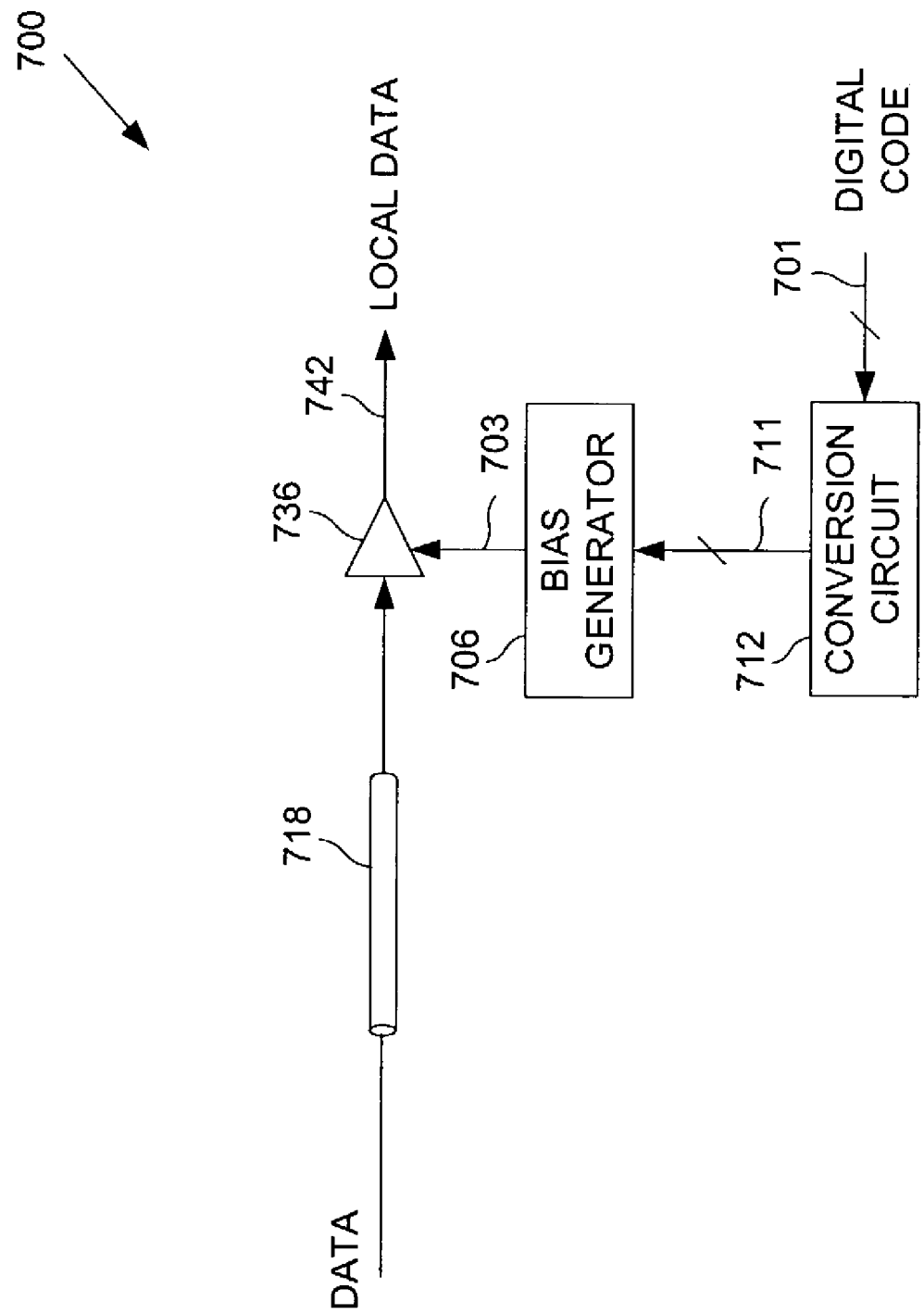
FIG. 8 shows a block diagram of a receiver circuit with an adjustable propagation delay in accordance with an embodiment of the present invention.

FIG. 8 shows a block diagram of an exemplary receiver circuit with an adjustable propagation delay (700) in accordance with an embodiment of the present invention. A data signal may be propagated on data path (718). A receiver circuit (736) may generate a corresponding signal representative of the data signal as a local data signal (742). A propagation delay through the receiver circuit (736) depends on the process variations, temperature variations, and/or voltage variations.

The receiver circuit with an adjustable propagation delay (700) includes a bias generator (706) that adjusts a propagation delay of the receiver circuit (736) using biasing signal (703). The bias generator (706) receives a digital control signal (711) from a conversion circuit (712). The conversion circuit receives a digital code (701) (i.e., control signal) from, for example, a replica driver (220 shown in FIG. 3). The digital code (701) may be representative of an impedance control code, for example, impedance control code (401 shown in FIG. 5). The impedance control code is indicative of adjustments made to a buffer and depends on the process, temperature, and/or voltage of the replica driver. Accordingly, the digital code (601) may be indicative of process variations, temperature variations, and/or voltage variations.

The conversion circuit (712) receives the digital code (701). The digital code (701) may not be used directly to adjust to the bias generator (706). Accordingly, the conversion circuit (712) converts the digital code (701) into a digital control signal (711) usable, either directly of indirectly, by the bias generator (706). The conversion circuit (712) may perform standard logic operations, may operate as a state machine, and/or may process the digital code (701). Because the digital code (701) may be indicative of conditions that may affect the propagation delay through the receiver circuit (736), the bias generator (706) may use the digital control signal (711) to adjust the receiver circuit (736).

Figure 9:
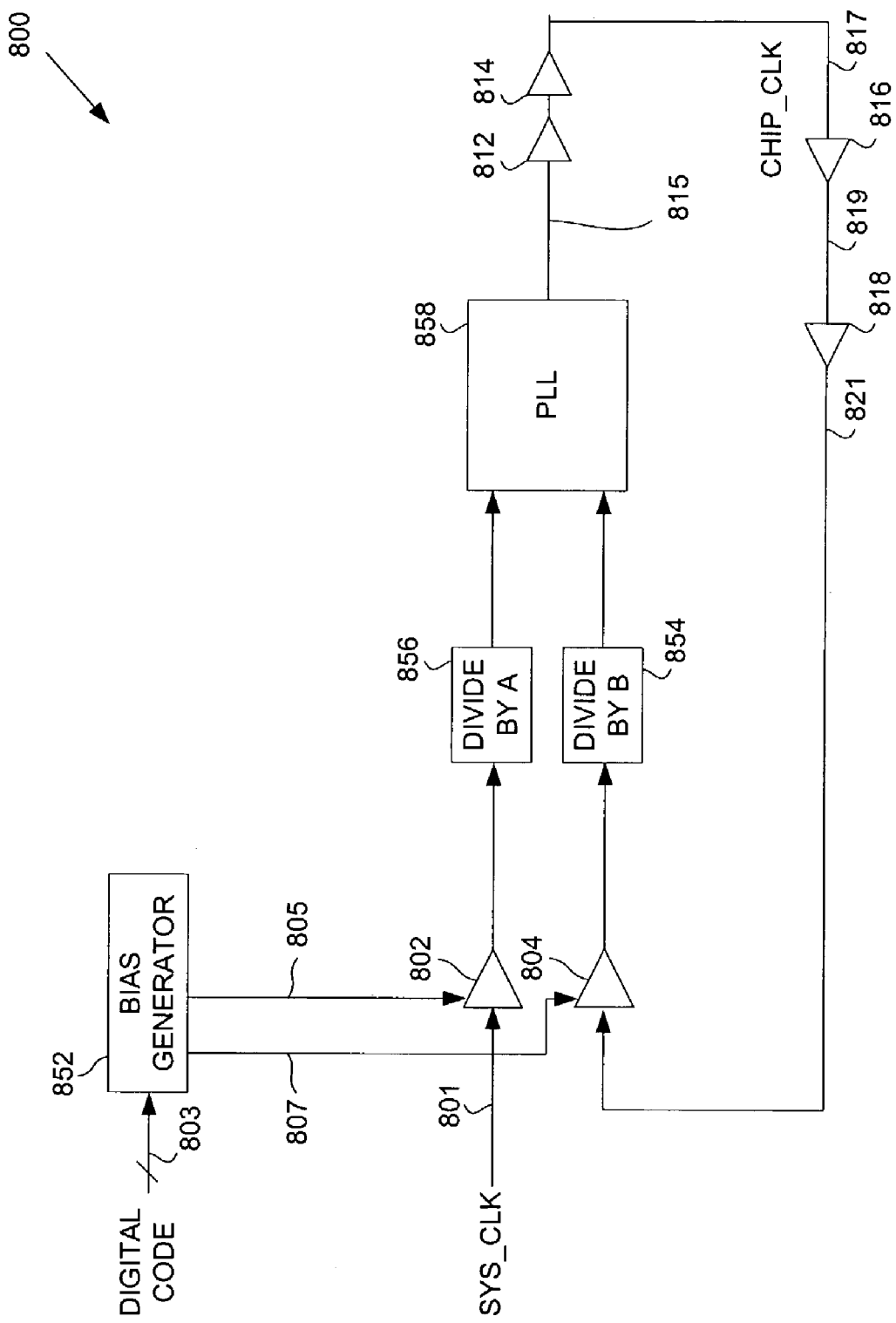
FIG. 9 shows a block diagram of a receiver circuit with an adjustable propagation delay of a phase locked loop in accordance with an embodiment of the present invention.

FIG. 9 shows a block diagram of an exemplary receiver circuit with an adjustable propagation delay of a phase locked loop (800) in accordance with an embodiment of the present invention. A receiver circuit (802) receives a system clock signal (801) that may originate external to an integrated circuit on which the receiver circuit with the adjustable propagation delay of a phase locked loop (800) is placed. Conversely, a receiver circuit (804) receives a clock signal (821) that may originate from circuits on an integrated circuit on which the receiver circuit with the adjustable propagation delay of a phase locked loop (800) is placed. Accordingly, a voltage potential swing and a transition time of the system clock signal (801) and the clock signal (821) may be different.

For example, the system clock signal (801) may have a small voltage potential swing and a slow transition time from a low voltage potential to a high voltage potential, and vice versa, of the small voltage potential swing. The clock signal (821) may have a voltage potential swing that is substantially the same as a difference between power supplies' voltage potentials. Also, a transition time from a low voltage potential to a high voltage potential, and vice versa, for the clock signal (821) may be faster than the transition time for the system clock signal (801). The differences between the system clock signal (801) and the clock signal (821) may cause a difference in a propagation time through the receiver circuits (802, 804). The difference in the propagation time may cause a static phase error.

In a typical design, for example, the difference in the propagation time for the receiver circuits (802, 804) may be minimized for a particular process, temperature, and/or voltage condition. However, process variations, temperature variations, and/or voltage variations in the receiver circuits (802, 804), coupled with variations in voltage potential swing and transition time between the system clock signal (801) and the clock signal (821) may still cause a static phase error. According to one or more embodiments of the present invention, the receiver circuits (802, 804) may be adjusted.

A phase locked loop (858) is designed to output a chip clock signal (817), which is a multiple of the system clock signal (801). When the PLL is in "lock," the chip clock signal (817) and system clock signal (801) maintain a specific phase and frequency relationship. To allow different multiplication ratios, the phase locked loop (858) may use several "divide by" circuits. A "divide by" circuit reduces the frequency of the input to the "divide by" circuit at its output by a specified factor. For example, the phase locked loop (858) uses a divide by A circuit (856) with the system clock signal (801) and a divide by B circuit (854) with the clock signal (821).

The "divide by" circuits (856, 854) determine a frequency multiplication factor provided by the phase locked loop (858). The addition of "divide by" circuits (856, 854) enables the phase locked loop (858) to multiply the system clock signal (801). Multiplying the system clock signal (801) is useful when the chip clock signal (817) must have a higher frequency than the system clock signal (801).

The clock signal (821) results from an output clock signal (815) generated by the phase locked loop (858). Signal buffers (812, 814) increase the drive strength of the output clock signal (815) to supply other circuits with the chip clock signal (817). The time delay created by the signal buffers (812, 814, 816, 818) is accounted for by a feedback of the clock signal (821) that is operatively supplied to the phase locked loop (858).

Because the propagation delay through the receiver circuits (802, 804) may be different, a bias generator (852) adjusts a propagation delay of the receiver circuits (802, 804) using biasing signals (805, 807), respectively. The bias generator (852) receives a digital code (803) (i.e., control signal) from, for example, a replica driver (220 shown in FIG. 3). The digital code (803) may be representative of an impedance control code, for example, impedance control code (401 shown in FIG. 5). The impedance control code is indicative of adjustments made to a buffer (302 shown in FIG. 4) and depends on the process, temperature, and/or voltage of the replica driver. Accordingly, the digital code (803) may be indicative of process variations, temperature variations, and/or voltage variations.

Because the digital code (803) is indicative of conditions that may affect the propagation delay through the receiver circuits (802, 804), the bias generator (852) may use the digital code (803) to adjust the receiver circuits (802, 804).

Figure 1:
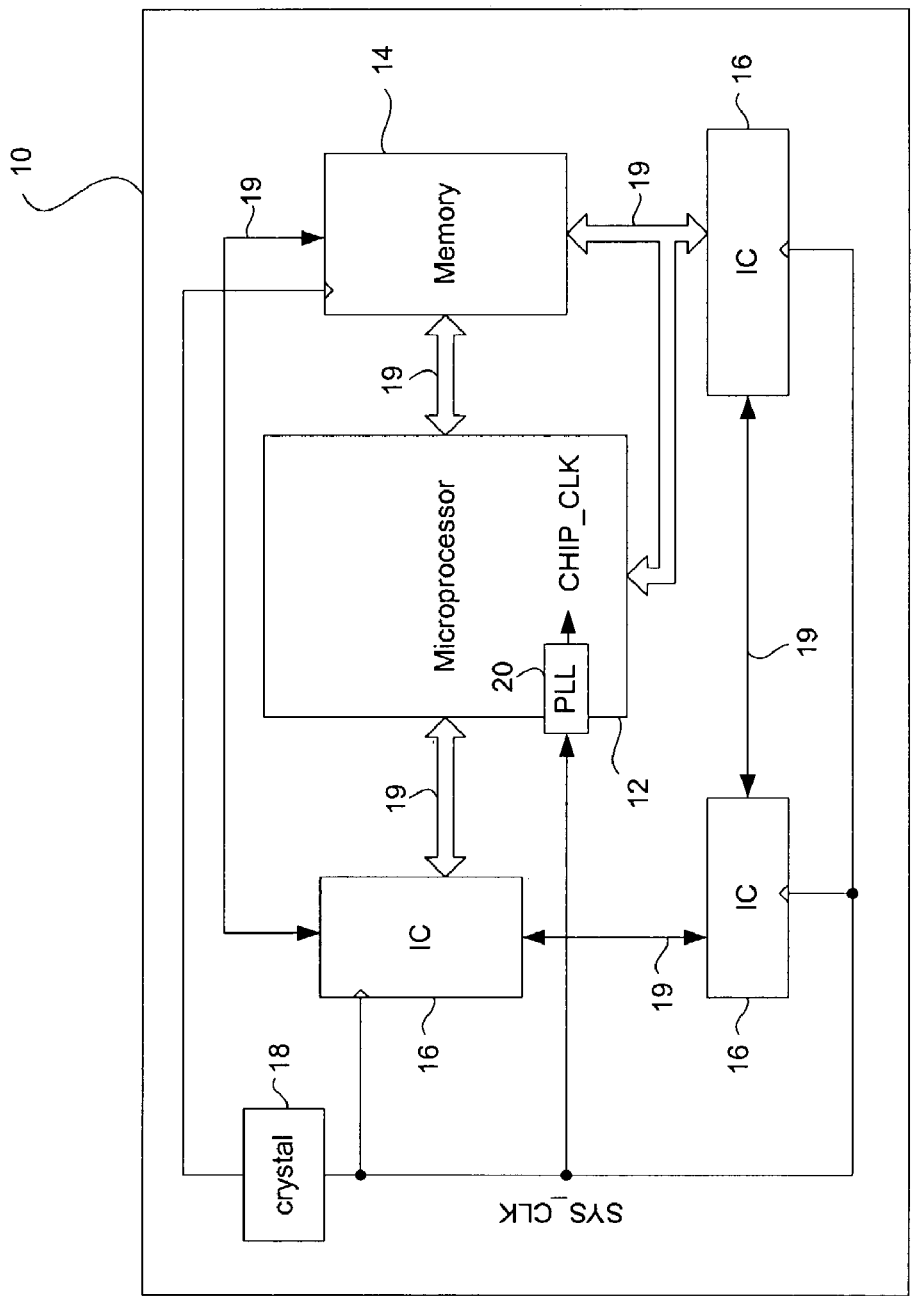
FIG. 1 shows a typical computer system.
Figure 2:
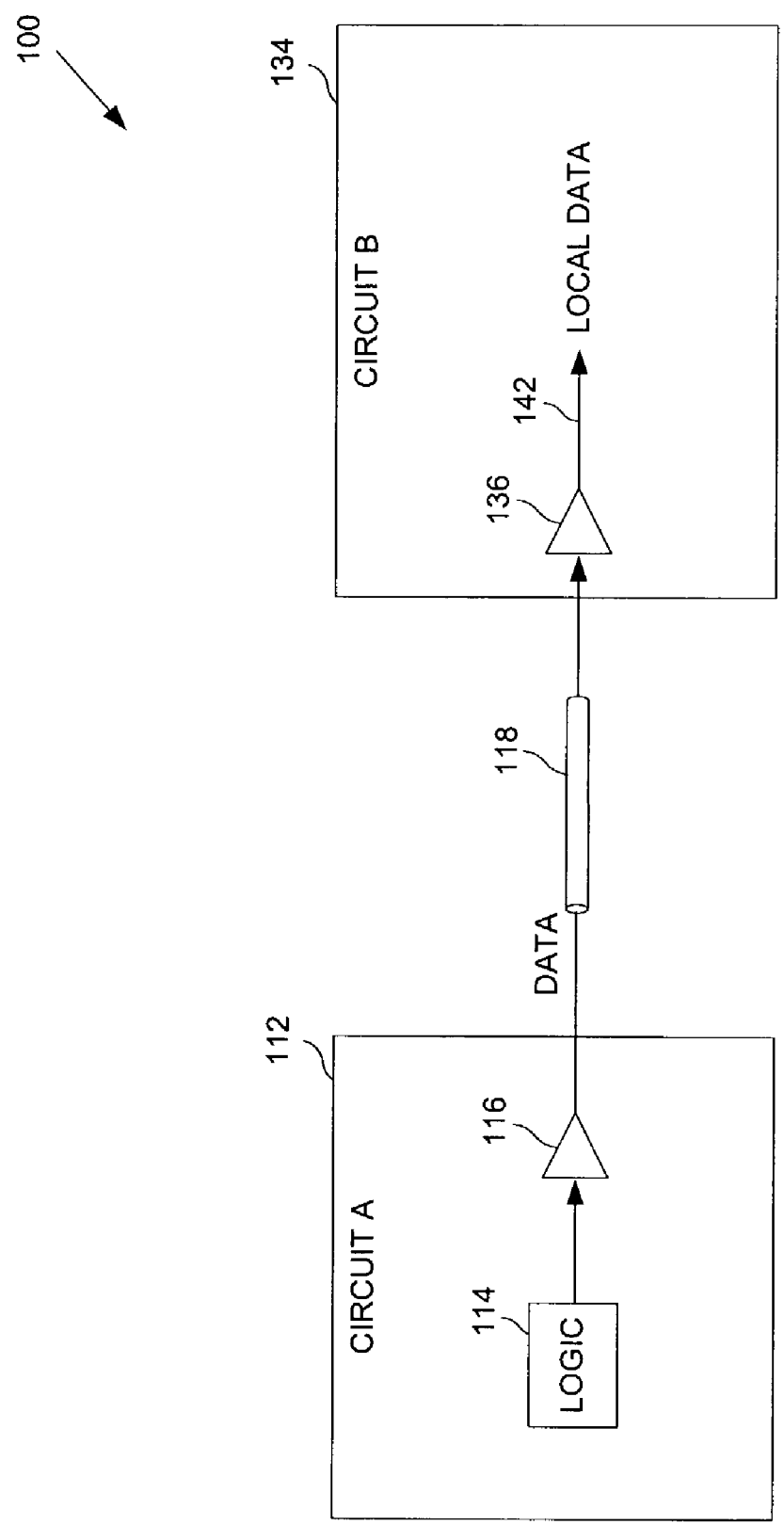
FIG. 2 shows a block diagram of a typical communication system.

For example, an impedance control code (401 shown in FIG. 5) generated by a replica driver (220 shown in FIG. 3) may increase a number of pull-up devices (402, 404, 406 shown in FIG. 5) that may pull-up an output signal on line (403 shown in FIG. 5) by 40%. The increase may occur due to a change in temperature and/or voltage potential experienced by the replica driver (220 shown in FIG. 3). Accordingly, the bias generator (852), having received an updated digital code (803), may adjust the receiver circuits' (802, 804) propagation delay by 10%. Adjustments made by the bias generator (852) to the receiver circuits (802, 804) may correlate to the changes made to a drive strength of the driver circuit (202 shown in FIG. 3) to control an impedance; however, the changes may not have the same value or ratio. The bias generator (852) adjusts the receiver circuits' (802, 804) propagation delay to minimize variations during an operation of the integrated circuit (e.g., microprocessor (12) shown in FIG. 1).

Figure 10:
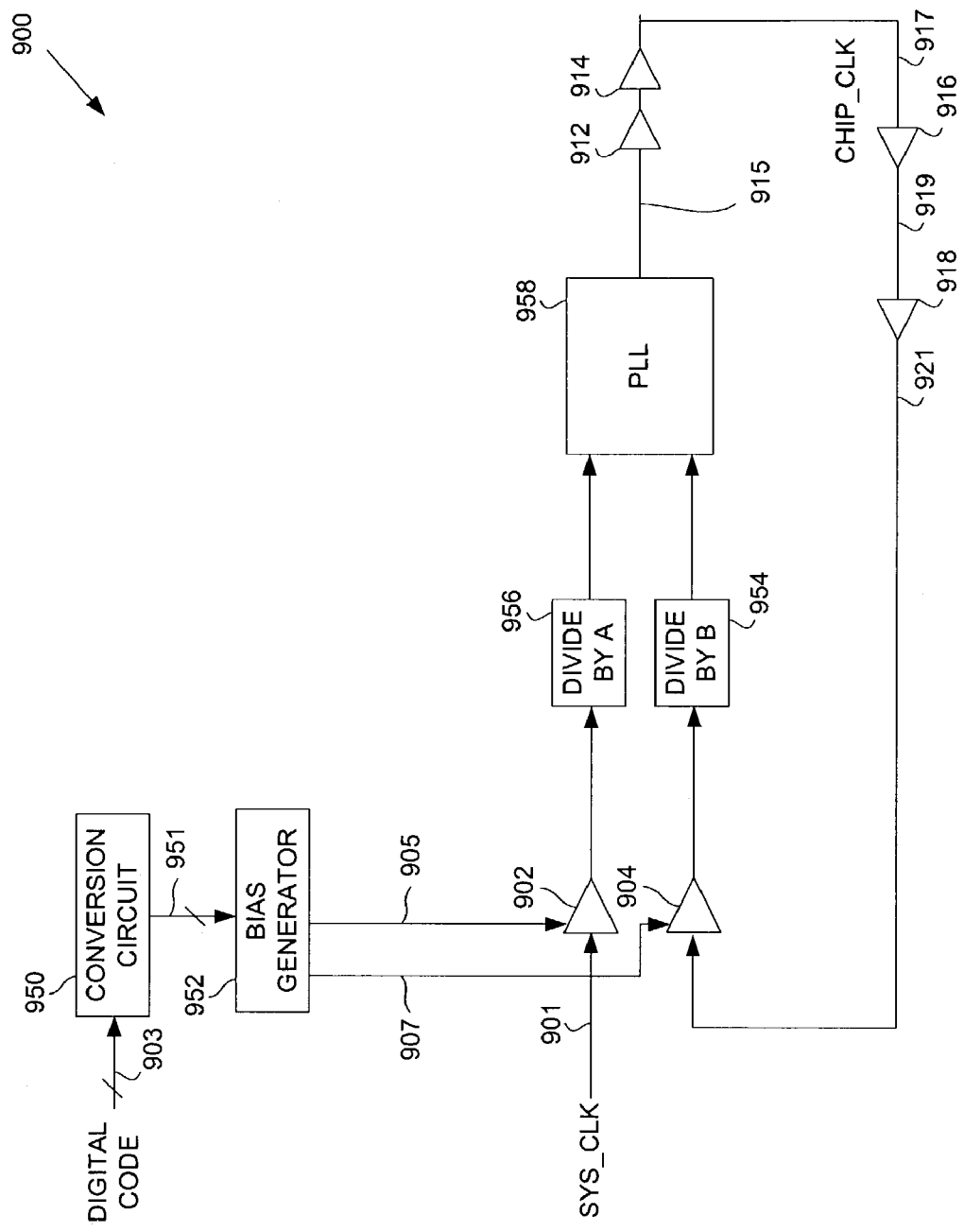
FIG. 10 shows a block diagram of a receiver circuit with an adjustable propagation delay of a phase locked loop in accordance with an embodiment of the present invention.

FIG. 10 shows a block diagram of an exemplary receiver circuit with an adjustable propagation delay of a phase locked loop (900) in accordance with an embodiment of the present invention. The receiver circuits (902, 904), divide by A circuit (956), divide by B circuit (954), phase locked loop (958), and signal buffers (912, 914, 916, 918) operate similarly to corresponding elements described in FIG. 9. A bias generator (952) adjusts a propagation delay of the receiver circuits (902, 904) using biasing signals (905, 907), respectively.

The bias generator (952) receives a digital control signal (951) from a conversion circuit (950). The conversion circuit receives a digital code (903) (i.e., control signal) from, for example, a replica driver (220 shown in FIG. 3). The digital code (903) may be representative of an impedance control code, for example, impedance control code (401 shown in FIG. 5). The impedance control code is indicative of adjustments made to a buffer and depends on the process, temperature, and/or voltage of the replica driver. Accordingly, the digital code (903) may be indicative of process variations, temperature variations, and/or voltage variations.

The conversion circuit (950) receives the digital code (903). The digital code (903) may not be used directly to adjust the bias generator (952). Accordingly, the conversion circuit (950) converts the digital code (903) into a digital control signal (951) usable, either directly of indirectly, by the bias generator (952). The conversion circuit (950) may perform standard logic operations, may operate as a state machine, and/or may process the digital code (903). Because the digital code (903) may be indicative of conditions that may affect the propagation delay through the receiver circuits (902, 904), the bias generator (952) may use the digital control signal (951) to adjust the receiver circuits (902, 904).

Figure 11:
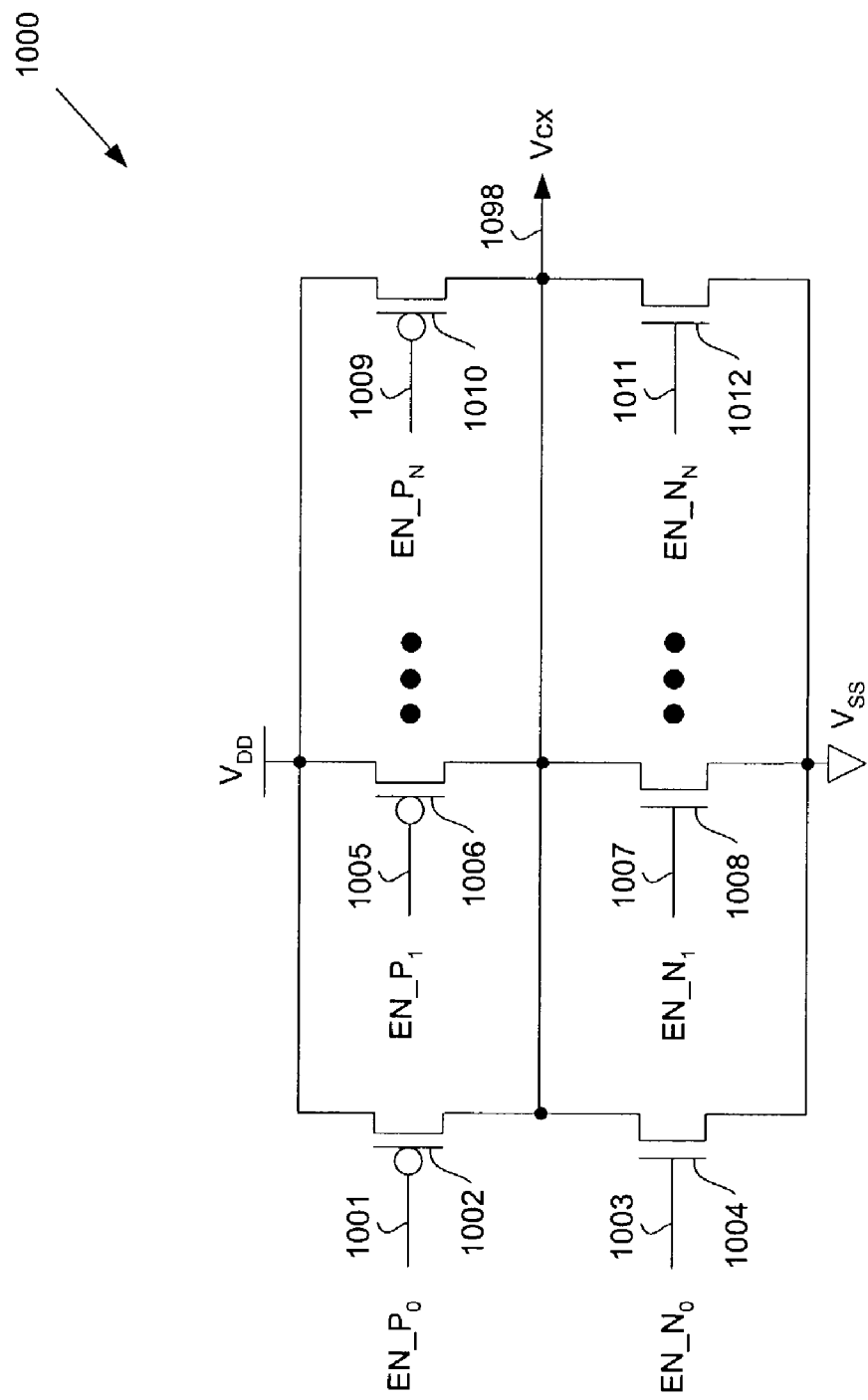
FIG. 11 shows a schematic diagram of a bias generator in accordance with an embodiment of the present invention.

FIG. 11 shows a schematic diagram of an exemplary bias generator (1000) in accordance with an embodiment of the present invention. In FIG. 11, the bias generator (1000) includes p-channel transistors (1002, 1006, and 1010) arranged in parallel with each other. The p-channel transistors (1002, 1006, and 1010) connect between a power supply, Vdd, and a common node, Vcx (1098). The common node Vcx (1098) provides a biasing signal, e.g., biasing signal (603). The bias generator (1000) also includes n-channel transistors (1004, 1008, and 1012) arranged in parallel with each other. The n-channel transistors (1004, 1008, and 1012) connect between ground, Vss, and the common node, Vcx (1098). The p-channel transistors (1002, 1006, and 1010) are controlled by control signals $EN\_P_0$ (1001), $EN\_P_1$ (1005), and $EN\_P_N$ (1009), respectively. The n-channel transistors (1004), (1008), and (1012) are controlled by control signals $EN\_N_0$ (1003), $EN\_N_1$ (1007), and $EN\_N_N$ (1011), respectively. A low voltage on any of the EN_P signals (1001, 1005, and 1009) will turn "on" their respective p-channel transistors (1002, 1006, and 1010). A high voltage on any of the EN_N signals (1003, 1007, and 1011) will turn "on" their respective n-channel transistors (1004, 1008, and 1012).

Any p-channel transistor (1002, 1006, and 1010) that is "on" will have a tendency to increase the voltage on Vcx (1098) toward Vdd. Any n-channel transistor (1004, 1008, and 1012) that is "on" will have a tendency to lower the voltage on Vcx (1098) toward Vss. By selecting which p-channel transistors (1002, (1006, and 1010) and/or n-channel transistors (1004, 1008, and 1012) are "on," a change in the voltage on Vcx (1098) may be achieved.

It should be understood that the p-channel transistors (1002, 1006, and 1010) and n-channel transistors (1004, 1008, and 1012) may be turned "on" individually or as a group. The p-channel transistors (1002, 1006, and 1010) and n-channel transistors (1004, 1008, and 1012) may be sized so that each transistor has a different effect as compared to the other transistors, e.g., a transistor's gate width may be varied to adjust the strength of the transistor. The gate widths may be designed to provide a linear, exponential, or other function as more transistors are turned "on." The p-channel transistors (1002, 1006, and 1010) and n-channel transistors (1004, 1008, and 1012) may be sized so that each transistor has an inherently resistive nature, e.g., a transistor's gate length may be increased (long-channel transistors) to increase the inherent resistance of the transistor. A larger inherent resistance may be advantageous if both a p-channel transistor and a n-channel transistor are "on" simultaneously. In other embodiments, the bias generator (1000) may include only one p-channel transistor and one n-channel transistor connected in series.

The control signals EN_N (1003, 1007, and 1011) and control signals EN_P (1001, 1005, and 1009) may be controlled directly or indirectly by a digital code, e.g., digital code (601) shown in FIG. 7. Those skilled in the art will appreciate that by selectively controlling the bias generator, such as the one shown in FIG. 10, the bias generator may be used to adjust a particular bias signal, e.g., bias signal (805 and 807) shown in FIG. 9, within a receiver circuit, e.g., receiver circuit (802 and 804) shown in FIG. 9, of a phase locked loop thereby adjusting current and resistive properties of particular circuitry within the receiver circuit in order to attain a desired propagation delay of a signal responsive to the particular circuitry. Furthermore, by selectively controlling the bias generator, such as the one shown in FIG. 10, the bias generator may be used to adjust a particular bias signal, e.g., bias signal (603) shown in FIG. 7, within a receiver circuit, e.g., receiver circuit (636) shown in FIG. 7, thereby adjusting current and resistive properties of particular circuitry within the receiver circuit in order to attain a desired propagation delay of a signal responsive to the particular circuitry.

Figure 12:
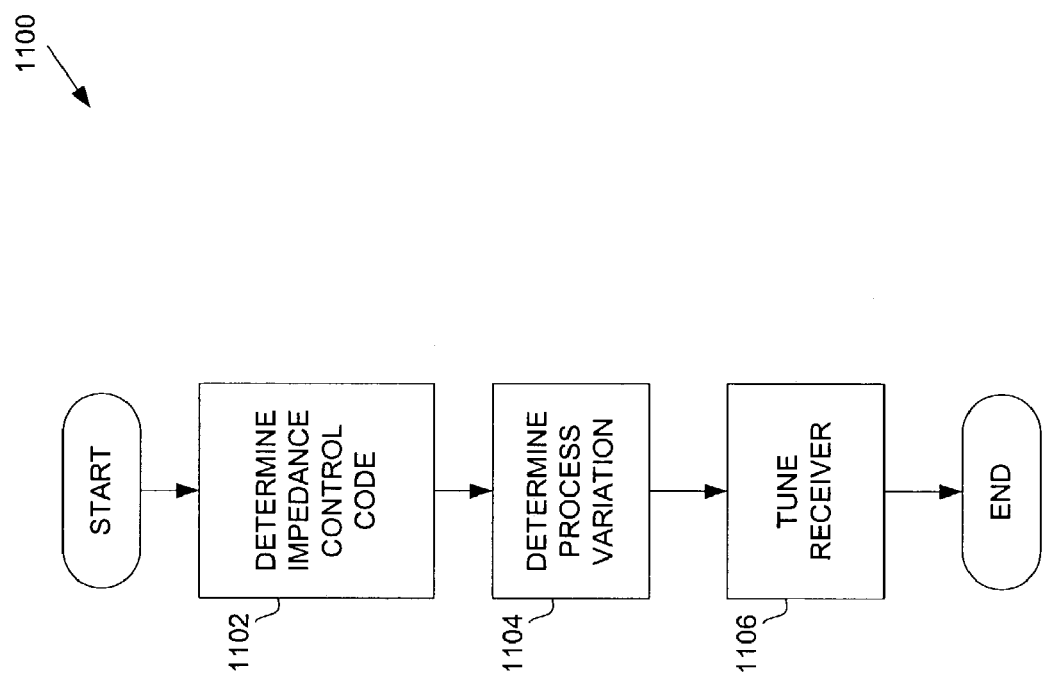
FIG. 12 shows a flow diagram of a receiver circuit adjustment in accordance with an embodiment of the present invention.

FIG. 12 shows an exemplary flow diagram (1100) of a receiver circuit adjustment in accordance with an embodiment of the present invention. In step 1102, an impedance control code is determined. Accordingly, a desired amount of drive strength from a transmission apparatus, e.g., transmission apparatus (200) shown in FIG. 3, is determined using the impedance control code. A replica driver circuit, e.g., a replica driver circuit (220) shown in FIG. 3, determines a desired amount of drive strength. The replica driver adjusts the drive strength until a desired drive strength is achieved. The impedance control code responsible for the desired drive strength is propagated to a driver circuit, e.g., driver circuit (202) shown in FIG. 3. Accordingly, the driver circuit, using the impedance control code provided by the replica driver circuit, has a desired drive strength.

A digital code (i.e., control signal), e.g., digital code (309) shown in FIG. 4, may be used to determine the impedance control code (step 1102). Also, the digital code may be used as the impedance control code. By determining an impedance control code in step 1102, a control signal provides not only an adjustment setting for the driver circuit, but also an indication of process variations. Accordingly, the process information, which may depend on temperature and/or voltage, may be determined from the control signal (step 1104).

The process information determined in step 1104 may be used to tune, or adjust, a receiver circuit (step 1106). The adjustment may use the control signal directly, or use a code inferred from the control signal that is representative of process variations. Furthermore, the control signal may be updated repeatedly, which in turn, may result in a repeated adjustment of the receiver circuit.

Advantages of the present invention may include one or more of the following. In one or more embodiments, because a receiver circuit is capable of being adjusted due to temperature variations, voltage variations, and/or process variations, a propagation delay through the receiver circuit may be controlled. Accordingly, variations in the propagation delay caused by temperature variations, voltage variations, and/or process variations may be reduced.

In one or more embodiments, a receiving circuit may be adjusted directly from information in a control signal. Conversely, the control signal may be converted to a usable form to adjust the receiver circuit.

A propagation delay through a receiver circuit varies due to temperature variations, voltage variations, and/or process variations. In one or more embodiments, the propagation delay through the receiver circuit is substantially more consistent because a control signal causes the receiver circuit to be adjusted. Therefore, the propagation delay through the receiver circuit has less variability across different temperature variations, voltage variations, and process variations.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus, comprising:
   a transmitting integrated circuit arranged to generate a control signal, wherein an impedance of a driver circuit is dependent on the control signal;
   a bias generator operatively connected to the transmitting integrated circuit, wherein the bias generator is dependent on the control signal; and
   a receiver integrated circuit operatively connected to the bias generator,
   wherein the bias generator is arranged to operatively adjust a propagation delay through the receiver integrated circuit.

2. The apparatus of claim 1, wherein the receiver integrated circuit is arranged to operatively receive data from the transmitting integrated circuit.

3. The apparatus of claim 1, wherein the receiver integrated circuit is arranged to operatively receive a clock signal generated from a phase locked loop.

4. The apparatus of claim 1, wherein the receiver integrated circuit is arranged to operatively receive a system clock signal.

5. The apparatus of claim 1, wherein the bias generator is arranged to operatively adjust the propagation delay dependent on at least one of the group consisting of a temperature variation, a voltage variation, and a process variation.

6. The apparatus of claim 1, further comprising:
   a conversion circuit operatively connected to the transmitting integrated circuit, wherein the conversion circuit is operatively adjusted by the control signal, and wherein the bias generator is adjustable by the conversion circuit.

7. The apparatus of claim 6, wherein the receiver integrated circuit is arranged to operatively receive data from the transmitting integrated circuit.

8. The apparatus of claim 6, wherein the receiver integrated circuit is arranged to operatively receive a clock signal generated from a phase locked loop.

9. The apparatus of claim 6, wherein the receiver integrated circuit is arranged to operatively receive a system clock signal.

10. The apparatus of claim 1, the transmitting integrated circuit comprising:
    a buffer arranged to output a reference voltage potential;
    a comparator arranged to generate an output signal dependent on a difference between the reference voltage potential and a desired reference voltage potential; and
    a state machine arranged to adjust the buffer dependent on the output signal from the comparator.

11. The apparatus of claim 10, the transmitting integrated circuit further comprising:
    a precision resistor operatively connected to the reference voltage potential.

12. The apparatus of claim 1, the driver circuit comprising:
    a plurality of transistors, wherein an impedance control code operatively adjusts at least one of the plurality of transistors.

13. A method, comprising:
    adjusting a drive strength of a signal transmitted by a first integrated circuit dependent on a control signal;
    generating a bias signal dependent on the control signal; and
    adjusting a propagation delay through a second integrated circuit dependent on the bias signal.

14. The method of claim 13, wherein the adjusting the drive strength of the transmitted signal comprises:
    outputting a reference voltage potential;
    comparing the reference voltage potential and a desired reference voltage potential; and
    adjusting the outputting dependent on the comparing.

15. The method of claim 13, wherein the adjusting the drive strength of the transmitted signal comprises:
    selectively switching at least one transistor of a plurality of transistors dependent on an impedance control code.

16. The method of claim 13, wherein adjusting the propagation delay is dependent on at least one of the group consisting of a temperature variation, a voltage variation, and a process variation.

17. The method of claim 13, further comprising:
    converting the control signal into a digital control signal, wherein the generating the bias signal is dependent on the digital control signal.

18. An apparatus, comprising:

means for adjusting a drive strength of a signal transmitted by a first integrated circuit dependent on a control signal;

means for generating a bias signal dependent on the control signal;

a second integrated circuit; and means for adjusting the propagation delay through the second integrated circuit dependent on the means for generating the bias signal.

19. The apparatus of claim 18, wherein the means for adjusting the drive strength of the transmitted signal comprises:

means for outputting a reference voltage potential;

means for comparing the reference voltage potential and a desired reference voltage potential; and means for adjusting the means for outputting dependent on the means for comparing.

20. The apparatus of claim 18, further comprising:

means for converting the control signal into a digital control signal, wherein the means for generating the bias signal is dependent on the digital control signal.

* * * * *

UNITED STATES PATENT AND TRADEMARK OFFICE
CERTIFICATE OF CORRECTION

| | | |
|---|---|---|
| PATENT NO. | : 7,263,628 B2 | Page 1 of 1 |
| APPLICATION NO. | : 10/378295 | |
| DATED | : August 28, 2007 | |
| INVENTOR(S) | : Claude R. Gauthier et al. | |

It is certified that error appears in the above-identified patent and that said Letters Patent is hereby corrected as shown below:

On the Title Page:

On the Title Page, Item (57) Abstract, should be --A method and apparatus adjusts a propagation delay through a receiver circuit. A transmission apparatus is arranged to generate a control signal where an impedance of a driver circuit is dependent on the control signal. A bias generator is operatively connected to the transmission apparatus and is dependent on the control signal. A receiver circuit is operatively connected to the bias generator where the bias generator is arranged to operatively adjust a propagation delay through the receiver circuit.--

Signed and Sealed this

Eighth Day of January, 2008

JON W. DUDAS
*Director of the United States Patent and Trademark Office*